United States Patent
Morihara et al.

(10) Patent No.: US 6,597,599 B2
(45) Date of Patent: Jul. 22, 2003

(54) SEMICONDUCTOR MEMORY

(75) Inventors: Toshinori Morihara, Tokyo (JP); Hiroki Shimano, Tokyo (JP); Katsumi Dosaka, Tokyo (JP); Kazutami Arimoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/188,977

(22) Filed: Jul. 5, 2002

(65) Prior Publication Data

US 2003/0021140 A1 Jan. 30, 2003

(30) Foreign Application Priority Data

Jul. 24, 2001 (JP) .......................... 2001-223554
Jan. 31, 2002 (JP) .......................... 2002-024192

(51) Int. Cl.[7] .................. G11C 11/24; G11C 5/02; G11C 5/06
(52) U.S. Cl. ..................... 365/149; 365/51; 365/63
(58) Field of Search ..................... 365/149, 51, 63

(56) References Cited

U.S. PATENT DOCUMENTS 5,523,965 A * 6/1996 Kaga et al. .................. 365/149
5,574,680 A * 11/1996 Kim et al. .................... 365/149
6,137,713 A * 10/2000 Kuroda et al. ............... 365/149
6,314,017 B1 * 11/2001 Emori et al. ................. 365/149

FOREIGN PATENT DOCUMENTS

JP          61-274357          12/1986

* cited by examiner

Primary Examiner—Trong Phan
(74) Attorney, Agent, or Firm—Burns, Doane, Swecker & Mathis, LLP

(57) ABSTRACT

In a semiconductor memory in which memory cells where a bit line is connected with the impurity diffused area of MOS transistors are arranged in a close packed layout in order to reduce the gate capacitance and junction capacitance of the impurity diffused area of the MOS transistor, the width W1 of the active region of the MOS transistor of field pattern FL constituting the memory cell is formed narrower than the width W2 of the active region of the capacitor.

6 Claims, 8 Drawing Sheets

SEMICONDUCTOR MEMORY

BACKGROUND OF THE INVENTION

1. Field of the Invention

The present invention relates to a system LSI on which a DRAM is merged, and more particularly, to a semiconductor memory such as a DRAM used for a system LSI fabricated in a logic process.

2. Description of Related Art

In order to mount a DRAM on a system LSI by means of a DRAM and logic hybrid process, a process step for forming a capacitor of a DRAM core having a complicated three-dimensional structure and further a planarization process step for reducing a difference in level (steps on the substrate) caused by the capacitor of the DRAM core having the three-dimensional structure are required in addition to a usual CMOS logic process. As a result, the number of the process steps greatly increases, and thereby the cost of the chip increases.

On the other hand, among merged memories that can be formed in a complete CMOS logic process is a SRAM. Conventionally, the SRAM has been used for a cache memory, a register file memory, and the like for a processor. However, in a personal digital assistant, in order to make its system configuration simple, the SRAM is widely used as the main memory. This is because the SRAM does not require a complicated memory control relating to a refresh operation that is indispensable to DRAMs, and further the SRAM is manageable.

However, also in the personal digital assistant, recently, its function has been greatly improved to process moving images, and required a large-capacity memory.

In the DRAM, with the progress of a microfabrication process, the size of the memory cell has shrunk, and the cell size of 0.3 $\mu m^2$ has been achieved in 0.18 $\mu m$ DRAM process for instance. On the other hand, in the SRAM, its memory cell consists of six transistors of p-ch and n-ch in total, and the SRAM is under the restrictions of an isolation distance between the p-well and n-well though the microfabrication process has become advanced. Accordingly, the SRAM has not shrunk in the size of the memory cell as much as the DRAM has done. The size of a SRAM memory in 0.18 $\mu m$ CMOS logic process is about 7 $\mu m^2$, which is 20 times larger than that of a DRAM memory cell. Consequently, in the SRAM, since the chip size is extremely larger as the capacity is larger, merging a 4 M bits or more SRAM is extremely difficult.

In view of such a situation, if a merged memory having a large capacity is constituted by use of a DRAM memory cell fabricated by a process similar to the CMOS logic process, a merged memory that is not as small as the memory size of a usual DRAM but sufficiently smaller than the memory size of the SRAM can be fabricated while holding down the rising of chip cost.

FIG. 10 is a layout view showing the layout of conventional DRAM memory cells. Referring to FIG. 10, field pattern FL is formed in a rectangular shape, and a plurality of them are arranged in a close packed layout in a matrix. Reference character W1 denotes the width of the active region of a MOS Tr (transistor), and W2 denotes the width of the active region of a capacitor.

Cell plate electrodes CP0–CP3 are arranged on the active regions of the capacitors of field patterns FL through capacitor insulation films, and subword lines WL0–WL3 are arranged by two on field patterns FL through gate oxide films, and serves as the gate electrodes of MOS Trs.

Bit lines ZBL0, BL0, ZBL1, and BL1 each are arranged on cell plate electrodes CP0–CP3 and subword lines WL0–WL3 through insulation films, and orthogonal to subword lines WL0–WL3. Bit line contacts BC each connect bit lines ZBL0, BL0, ZBL1, and BL1 to the impurity-diffused areas of the MOS Trs. Reference characters MC1 and MC2 each denote the memory cells, and sense amplifiers S/A differentially amplify and output the potential of each of a pair of bit lines ZBL0 and BL0, and a pair of bit lines ZBL1 and BL1.

The operation of the conventional memory cells will next be described.

A row active command is given, and under row selecting operation, one of subword lines WL0–WL3 is selected in FIG. 10 for instance. Thus, two memory cells each are connected with a pair of the bit lines.

For instance, when subword line WL0 is selected, memory cells MC1 and MC2 are connected with the pair of bit lines ZBL0 and BL0. H level data is memorized in one of memory cells MC1 and MC2, and L level data is memorized in the other, thereby memorizing or storing one bit information by taking a pair of memory cells MC1 and MC2 as a memory unit in two cell mode (twin cell mode).

Sense amplifier S/A connected with the pair of bit lines ZBL0 and BL0 differentially amplifies and outputs the potential of the pair of bit lines ZBL0 and BL0.

Since the conventional semiconductor memory or storage device has been arranged as mentioned above, a voltage (data) memorized is read out by sense amplifier S/A from the impurity diffused area of the MOS Tr connected therewith through the pair of bit lines ZBL0 and BL0, and bit line contact BC. However, as shown in FIG. 10, because the active region of the MOS Tr and the active region of the capacitor of field pattern FL are formed such that they have the same width (W1 and W2), the gate capacitance of the MOS Tr and the junction capacitance of the impurity diffused area are inevitably large. As a result, there is a drawback that the rise of the readout voltage is slow due to the influence thereof, and thereby the high-speed access cannot be performed.

SUMMARY OF THE INVENTION

The present invention has been made to solve the above-mentioned drawback. An object of the present invention is to provide a semiconductor memory having a layout of memory cells capable of rising promptly a readout voltage to allow high-speed access.

According to a first aspect of the present invention, there is provided a semiconductor memory including: in a plurality of field patterns arranged in a close packed layout in a matrix, a cell plate electrode which is arranged on the active region of the capacitor of the field pattern, a word line which is arranged by two on the field pattern, a bit line which is arranged on said cell plate electrode and to be orthogonal to said word line, and which are connected to an impurity diffused area of the transistor of said field pattern, and a sense amplifier for differentially amplifying and outputting each potential of a pair of bit lines composed of the two bit lines, wherein the width of the active region of the transistor of the field pattern is formed narrower than that of the active region of the capacitor.

In such a way, in the field pattern, the gate capacitance of the transistor connected with the bit line, and the junction capacitance of the impurity diffusion area can be reduced as compared with the gate capacitance and junction capacitance in the rectangular field pattern, thereby obtaining a layout of memory cells in which a readout voltage rises quickly to thereby perform high-speed access.

In addition, in the field pattern, the occupancy rate of the active region of the transistor in the cell size of one bit can be reduced, and thereby an optimum layout for the CMP (chemical, mechanical, and polishing) processes can be obtained upon the formation of trench isolations.

DETAILED DESCRIPTION OF THE PREFERRED EMBODIMENTS

An embodiment of the present invention will be described below.
Embodiment 1

Figure 1:
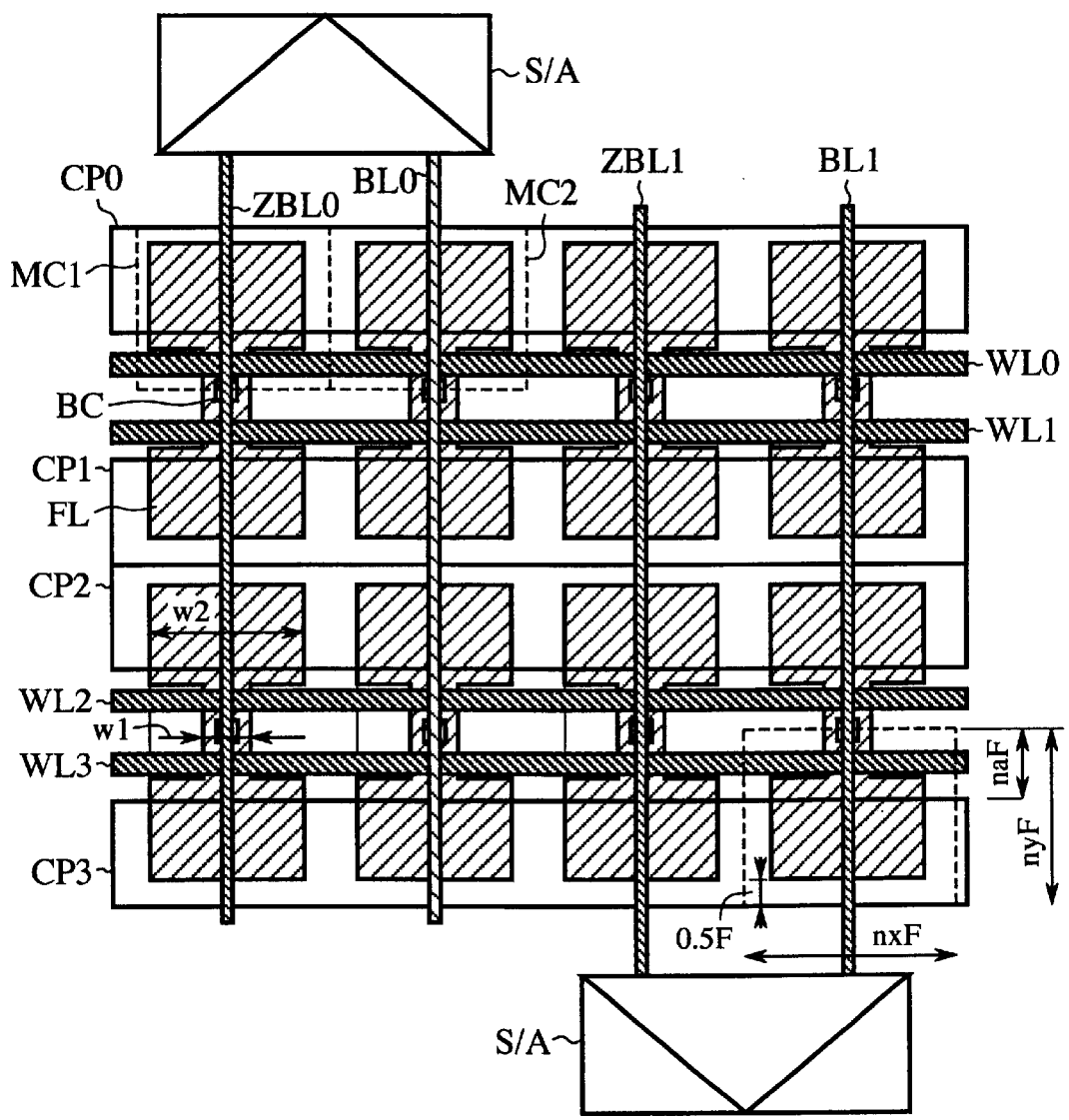
FIG. 1 is a layout view showing the layout of the DRAM memory cells according to an embodiment 1 of the present invention.

FIG. 1 is a layout view showing the layout of the DRAM memory cells according to an embodiment 1 of the present invention. Referring to FIG. 1, reference character FL denotes a plurality of field patterns FL arranged in a close packed layout in a matrix. Reference W1 denotes the width of the active region of a MOS Tr (transistor), and W2 denotes the width of the active region of a capacitor.

Cell plate electrodes CP0–CP3 are arranged on the active regions of the capacitors of field patterns FL through the capacitor insulation films. Subword lines (word lines) WL0–WL3 are arranged by two on field patterns FL through gate oxide films, and to be the gate electrodes of MOS Trs.

Bit lines ZBL0, BL0, ZBL1, and BL1 each are arranged on cell plate electrodes CP0–CP3 and subword lines WL0–WL3 through insulation films, and orthogonal to subword lines WL0–WL3. Bit line contacts BC connect each of bit lines ZBL0, BL0, ZBL1, and BL1 to the impurity diffused areas of MOS Trs. Reference characters MC1 and MC2 denote the memory cells, and sense amplifiers S/A differentially amplify and output the potential of each of a pair of bit lines ZBL0 and BL0, and a pair of bit lines ZBL1 and BL1.

The operation of the first embodiment will next be described.

Referring to FIG. 1, cell plate electrodes CP0–CP3, and subword lines WL0–WL3 to be the gate electrodes of the MOS Trs consist of the same wiring layer formed of polysilicon into which impurities are incorporated (doped polysilicon) or silicon-containing materials such as polycide and salicide such as WSix and CoSix. This wiring layer is also used for the gate electrode of the transistor in the CMOS logic process.

The capacitor has a planar-type capacitor structure in which a storage node is the diffused layer on the semiconductor substrate. The insulation films existing just under subword lines WL0–WL3 and just under cell plate electrodes CP0–CP3 are the gate oxide film of the MOS Tr of the memory cell and the capacitor insulation film of the memory cell, respectively, and can be formed of the same oxide film or also the oxide films having a different film thickness formed by means of a dual-gate oxidation process. Additionally, bit lines ZBL0, BL0, ZBL1, and BL1 have a CUB structure formed over the upper layers of cell plate electrodes CP0–CP3 by use of the first metal wiring and the like.

Thus, because a wiring layer for cell plate electrodes CP0–CP3 and the storage node need not to be newly added, and additionally cell plate electrodes CP0–CP3 and subword lines WL0–WL3 are formed of the same wiring layer by use of the planar-type capacitor structure, a difference in level between the memory array section and the peripheral circuit section is not produced. As a result, the memory cell array can be formed in the CMOS logic process without using planarization process by means of CMP (Chemical Mechanical Polishing process) or reducing the difference in level.

As shown in FIG. 1, memory cells MC1 and MC2 are arranged in a close packed layout. The memory cell array of usual DRAM cells has poor noise immunity in the close packed layout, and has to take only an open bit line configuration.

However, as shown in FIG. 1, because complementary data is read by a pair of adjacent bit lines in two cells mode, and differentially amplified by sense amplifier S/A, a folded bit line configuration can be taken.

Moreover, because the active region of the MOS Tr of field pattern FL is formed such that width W1 of the active region is narrower than width W2 of the active region of the capacitor, the gate capacitance and the junction capacitance of the impurity diffused areas of MOS Trs connected to each other through pairs of bit lines ZBL0, BL0, ZBL1, BL1, and bit line contacts BC can be reduced as compared with the prior art. As a result, the readout voltage quickly rises, and the high-speed access becomes possible.

In addition, because the width W1 of the active region of the MOS Tr of field pattern FL is formed narrower than width W2 of the active region of the capacitor, the occupancy rate of the active region of the memory cell Tr in the cell size of one bit can be reduced, and the layout suitable for the CMP process is obtained when a trench isolation is formed.

The memory cell in the conventional DRAM has been generally an about 2:1 size ratio in a length and width direction. That is, a $8F^2$ cell in which the width is 2F and the length is 4F has been adopted. Here, F is a value that is referred to as "Feature Size" of the design, and the value that is the design standard (the lower limit) to which a margin (for an overlap in the transcription process) is added.

Referring to FIG. 1, the size of the cell is set to nxF crosswise (in a word line direction) and nyF lengthwise (in a bit line direction). Accordingly, the area of the planar-type capacitor in the memory cell Scap and the size of the cell Scell each are given by the following formulas:

$$Scap=(nxF-F)\times(nyF-naF-0.5F),$$

where naF is defined as a distance from the center of FL to the end of CP, by force (see FIG. 1).

$$Scell=nxF\times nyF$$

The memory cell minimizing the cell size Scell to Scap securing the required capacitance Cs of the capacitor can be fabricated by greatly enlarging a length-to-width ratio as compared with the one of the conventional DRAM.

Figure 2:
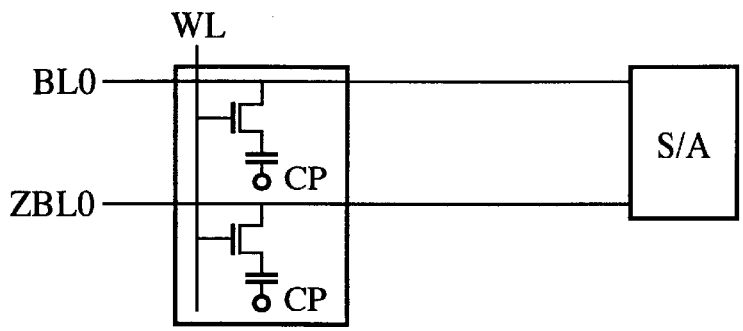
FIG. 2 is a circuit diagram showing the equivalent circuit of the DRAM memory cells according to the embodiment 1 of the present invention.

FIG. 2 a circuit diagram showing the equivalent circuit of the DRAM memory cells formed on cell plate CP according to the embodiment 1 of the present invention. The operation of the circuit of the DRAM memory cell will next be described with reference to FIG. 1 and FIG. 2.

A row active command is given, and while operating row selection, one of subword lines WL0–WL3 is selected in FIG. 1 for instance. Thus, two memory cells each are connected with a pair of the bit lines.

For instance, when subword line WL0 is selected, memory cells MC1 and MC2 are connected with the pair of bit lines ZBL0 and BL0. H level data is memorized in one of memory cells MC1 and MC2, and L level data is memorized in the other, to thereby memorize one bit information by taking a pair of memory cells MC1 and MC2 as a memory unit in two cell mode (twin cell mode).

As shown in FIG. 2, sense amplifier S/A connected with the pair of bit lines ZBL0 and BL0 differentially amplifies and outputs the potential of the pair of bit lines ZBL0 and BL0.

The time variations of the potentials of the storage nodes SN of memory cells MC1 and MC2 in which H level data (i.e. SN,H) and L level data (i.e. SN,L) are written are approximately indicated by the following formulas:

$$V(SN,H) \approx Vbb+(VCCS-Vbb)\cdot exp(-T/\tau a)$$

$$V(SN,L) \approx Vbb\cdot(1-exp(-T/\tau b))$$

where Vbb is a negative voltage applied to the substrate area of the memory cell; VCCS is a driving voltage of the sense amplifier; T is time; and $\tau a$ and $\tau b$ are time constants determined depending on the leakage current between the storage node and the capacitor electrode, the leakage current between the storage node and the substrate, and the off-state current of the memory cell Tr.

Readout potential difference $\Delta Vbl$ of the pair of bit lines ZBL0 and BL0 when the cell data is read out to the pair of bit lines ZBL0 and BL0 in two cell mode, is shown by the following formula:

$$\Delta Vbl=Cs\cdot(V(SN,H)-V(SN,L))/(Cs+Cb)$$

where Cs is the capacitance of a capacitor, and Cb is a bit line capacitance.

As mentioned above, according to the embodiment 1, because width W1 of the active region of the MOS Tr of field pattern FL is formed narrower than width W2 of the active region of the capacitor, the gate capacitance and the junction capacitance of the impurity diffused area of the MOS Tr can be reduced as compared with the prior art. As a result, the readout voltage quickly rises, and the high-speed access becomes possible. Moreover, the occupancy rate of the active region of the memory cell Tr to the cell size of one bit can be reduced, and the layout suitable for the CMP process is obtained when a trench isolation is formed.

Embodiment 2

Figure 3:
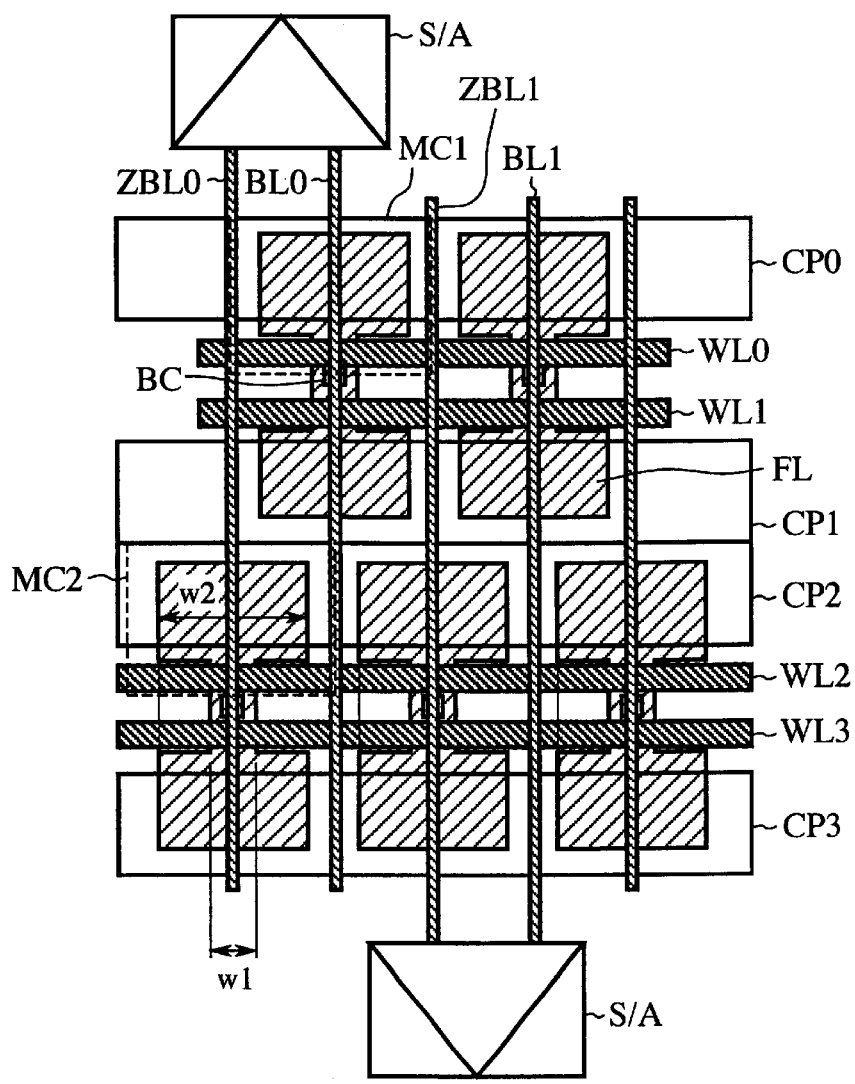
FIG. 3 is a layout drawing showing the layout of the DRAM memory cells according to an embodiment 2 of the present invention.

FIG. 3 is a layout view showing the layout of the DRAM memory cells according to an embodiment 2 of the present invention. Referring to FIG. 3, the row of the active region patterns in the row of the memory cells selected by subword lines WL2 and WL3 are arranged offset by half a pitch to the row of the active region patterns in the row of the memory cells selected by subword lines WL0 and WL1 select in a word line direction.

The pair of memory cells MC1 and MC2 is set to a memory unit in one bit/two cells mode (twin cell mode), and the bit line pair is given by ZBL0 and BL0. Moreover, the folded bit line configuration is taken.

The other configurations other than the above are the same as those in FIG. 1.

The operation of the second embodiment will next be described.

Figure 4:
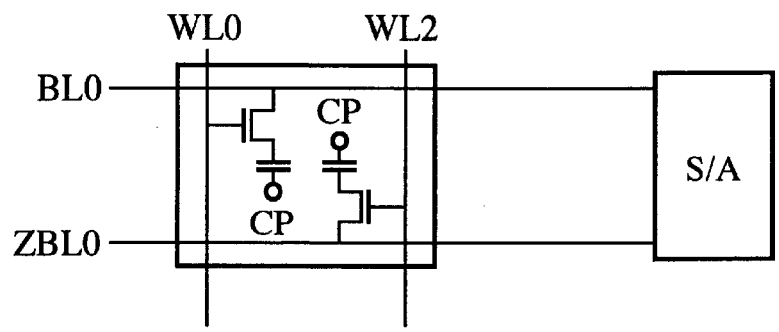
FIG. 4 is a circuit diagram showing the equivalent circuit of the DRAM memory cells according to the embodiment 2 of the present invention.

FIG. 4 is a circuit diagram showing the equivalent circuit of the DRAM memory cells formed on Cell Plate CP according to Embodiment 2 of the present invention. The operation of the circuit of the DRAM memory cell will next be described with reference to FIG. 3 and FIG. 4.

A row active command is given, and under operating row selection, in FIG. 4, the pairs of subword lines (WL0, WL2), (WL1, WL3), . . . are simultaneously selected with one subword line placed between them by shrinking, for instance, the row of 2 bits (RA<1>) from the lowest row in the row address. Thus, two memory cells are selected at the same time. For instance, when the pair of subword lines WL0 and WL2 is selected, memory cells MC1 and MC2 are connected with the pair of bit lines ZBL0 and BL0. H level data is memorized in one of memory cells MC1 and MC2, and L level data is memorized in the other, to thereby memorize one bit information by taking a pair of memory cells MC1 and MC2 as a memory unit in one bit/two cell mode (twin cell mode).

As shown in FIG. 4, because the complementary memory cell data of the pair of memory cells are always read out to the pair of bit lines ZBL0 and BL0 by simultaneous selection of the pair of subword lines WL0 and WL2, sense amplifier S/A differentially amplifies and outputs the potential difference of H level data and L level data read out to the pair of bit lines ZBL0 and BL0.

As mentioned above, according to Embodiment 2, the feature of the configuration of Embodiment 1 can be applied also to the semiconductor memory arranged offset by half a pitch in a word line direction.

Embodiment 3

Figure 5:
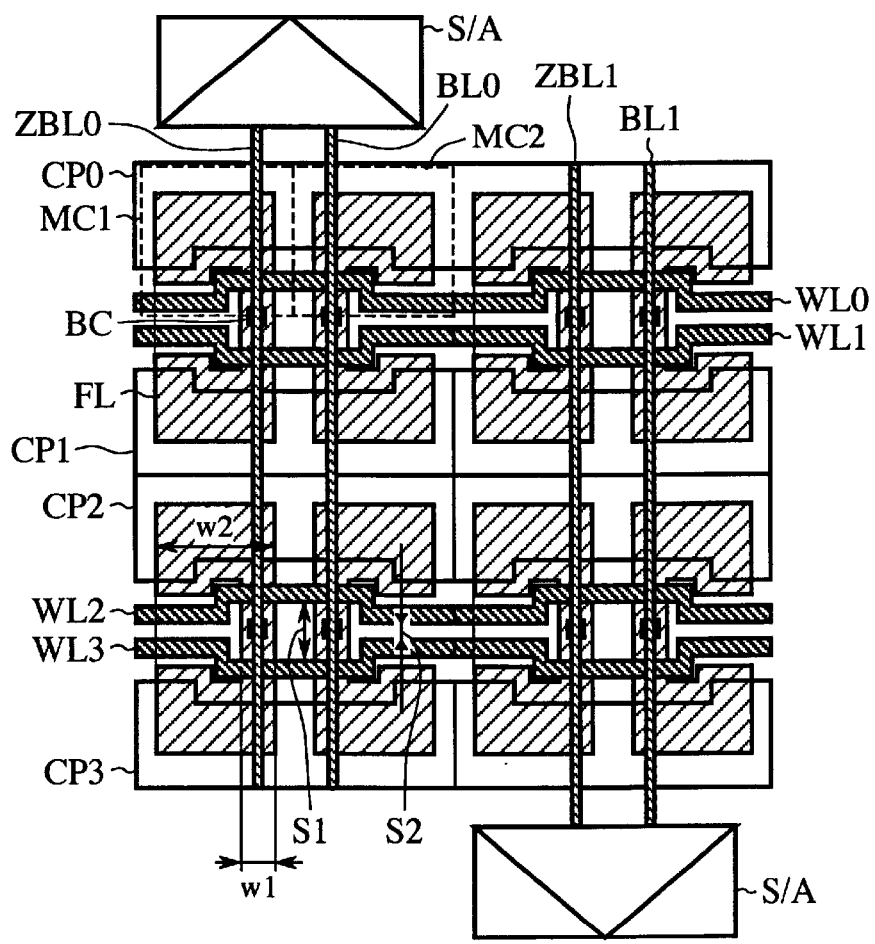
FIG. 5 is a layout view showing the layout of the DRAM memory cells according to an embodiment 3 of the present invention.

FIG. 5 is a layout view showing the layout of the DRAM memory cells according to an embodiment 3 of the present invention. Referring to FIG. 5, reference character FL denotes a field pattern formed in a C type or a inverted-C type layout, and a plurality of them are arranged in a close packed layout in a matrix. Reference character W1 denotes the width of the active region of a MOS Tr (transistor), and W2 denotes the width of the active region of a capacitor.

Reference characters CP0–CP3 denote cell plate electrodes formed on the active regions of the capacitors of field patterns FL in conform to the shape of the active regions of the capacitors, and arranged through the capacitor insulation film. Subword lines (word lines) WL0–WL3 are arranged by two on field pattern FL through gate oxide films, and to be the gate electrodes of MOS Trs. Reference character S1 denotes the space between the word lines in the part where bit line contact BC is arranged, and S2 is the space between the word lines in the other part on isolation.

The configurations other than the above are the same as those in FIG. 1.

The operation of the third embodiment will next be described.

As shown in FIG. 5, space S1 between the word lines in the part where bit line contact BC is arranged is made wider than space S2 between the word lines in the other part on isolation, to thereby enable the increase in the area of the capacitor occupying a memory cell of one bit. As a result, this reduces the area of the memory cell, and miniaturizes the memory cell.

As mentioned above, according to the embodiment 3, in addition to the effect of the embodiment 1, increase of the area of the capacitor occupying a one-bit memory cell becomes possible. As a result, this reduces the area of the memory cell, and miniaturizes the memory cell.

Additionally, the feature of the configuration of Embodiment 3 may be added to that shown in Embodiment 2.

Embodiment 4

Figure 6:
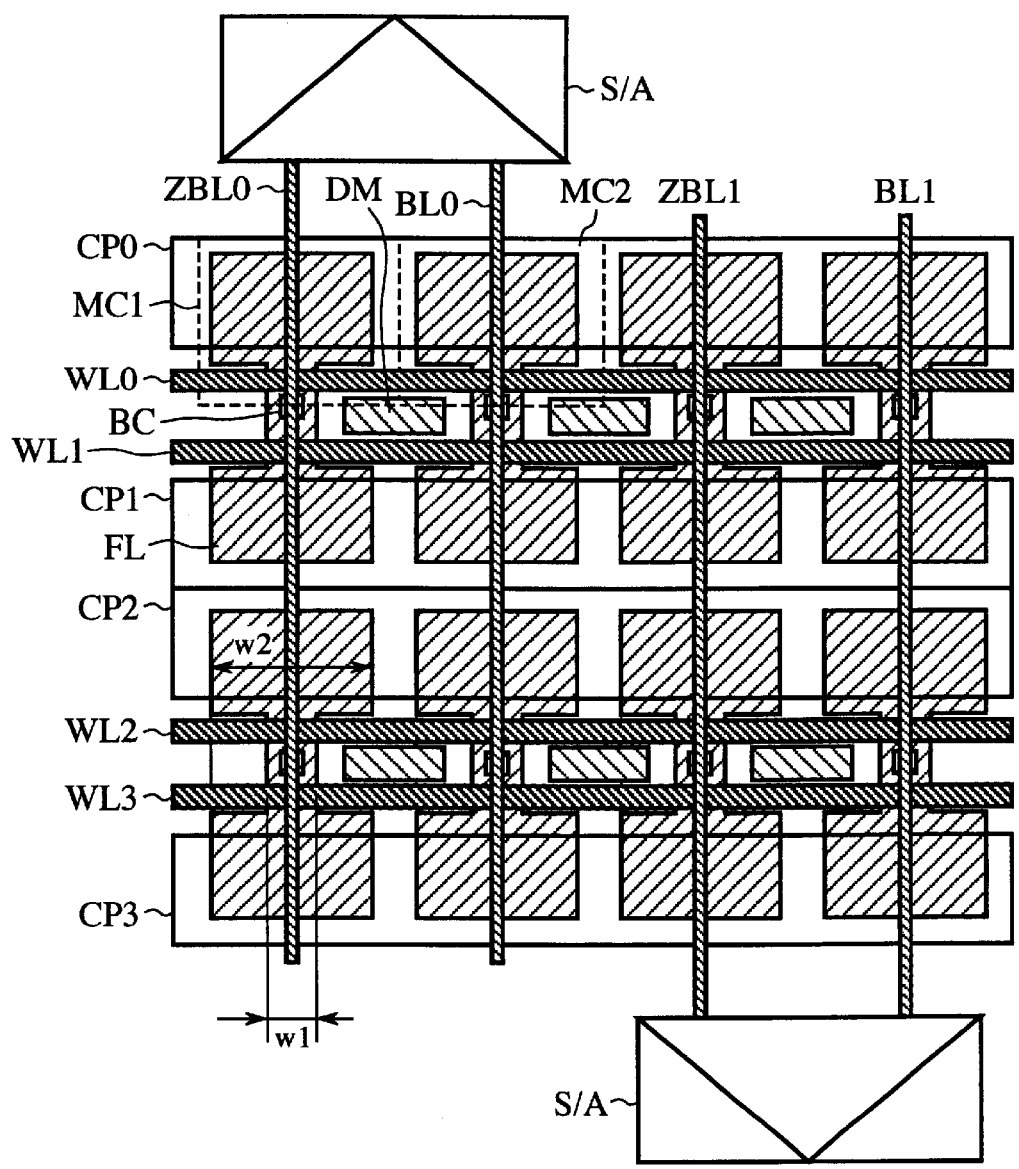
FIG. 6 is a layout view showing the layout of the DRAM memory cells according to an embodiment 4 of the present invention.

FIG. 6 is a layout view showing the layout of the DRAM memory cells according to an embodiment 4 of the present invention. Referring to FIG. 6, reference character DM denotes a dummy pattern formed and arranged adjacent to field pattern FL in the part disposed by bit line contact BC.

The configurations other than the above is the same as that in FIG. 1.

The operation of the fourth embodiment will next be described.

As shown in FIG. 6, field pattern FL of bit line contact BC can be appropriately formed when a trench isolation is formed, by arranging dummy pattern DM adjacent to field pattern FL in the part where bit line contact BC is arranged.

Particularly, because the thickness of oxide film is reduced by means of CMP (Chemical Mechanical Polishing) process when the trench isolation is formed, the thickness of the film is occasionally too much reduced in thin field pattern FL. However, dummy pattern DM can prevent the film thickness of field pattern FL from being too much reduced.

As mentioned above, according to Embodiment 4, in addition to the effect of Embodiment 1, when the trench isolation is formed, too much reduction of the film thickness of field pattern FL can be prevented by dummy pattern DM.

The feature of the configuration of Embodiment 4 may be added to the configuration shown in Embodiment 2 or 3.

Embodiment 5

Figure 7:
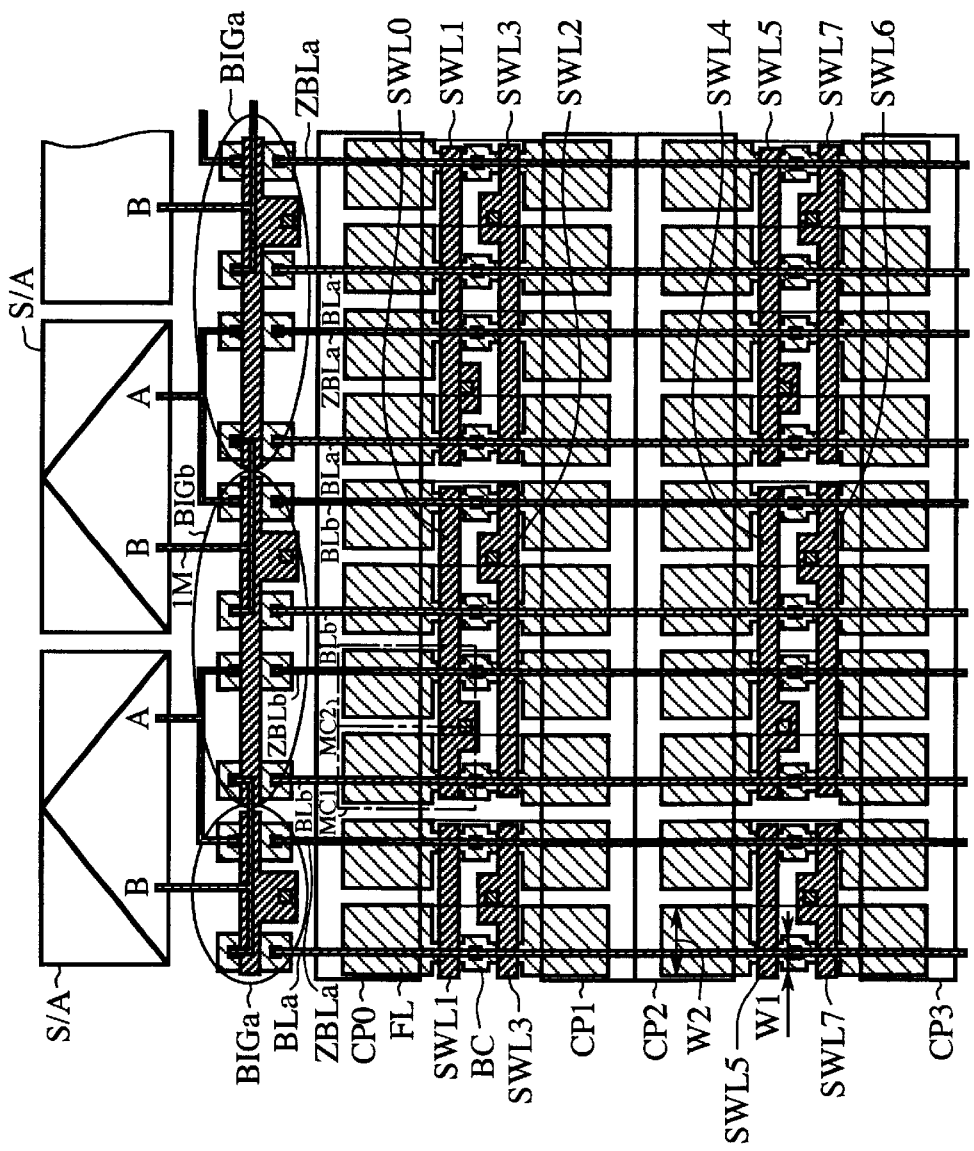
FIG. 7 is a layout view showing the layout of the DRAM memory cells according to an embodiment 5 of the present invention.
Figure 8:
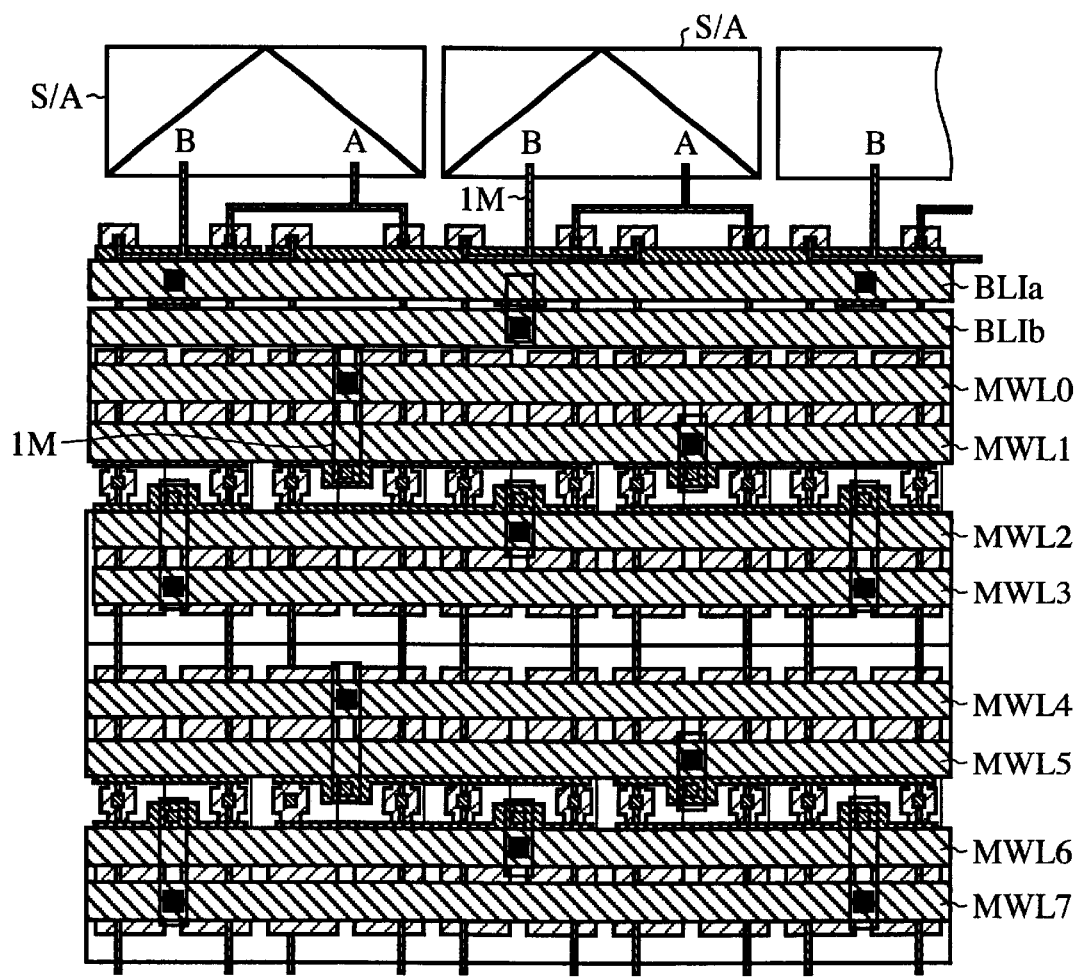
FIG. 8 is a layout view showing the layout of the DRAM memory cells according to the embodiment 5 of the present invention.

FIGS. 7 and 8 are layout views showing the DRAM memory cells according to an embodiment 5 of the present invention. FIG. 7 shows layer patterns from field patterns to first metal wirings, and FIG. 8 shows layer patterns from the field patterns to second metal wirings.

Referring to FIGS. 7 and 8, field patterns FL are formed in a C type or an inverted-C type layout, and a plurality of the field pattern FL are arranged in a close packed layout in a matrix. Reference character W1 denotes the width of the active region of a MOS Tr (transistor), and W2 denotes the width of the active region of a capacitor.

Reference characters CP0–CP3 denote cell plate electrodes CP0–CP3 arranged on the active regions of the capacitors of field patterns FL through a capacitor insulation film, SWL0–SWL3 denote subword lines (word lines) which are divided by two pairs of a memory cell pair to be a memory unit of one bit/two cells mode, are arranged by two on field patterns FL through the gate oxide film, and serves as gate electrodes of MOS Trs.

Reference characters BLa, ZBLa, BLb, and ZBLb denote bit lines, each arranged on cell plate electrodes CP0–CP3 and subword lines SWL0–SWL7 through insulation films, and orthogonal to subword lines SWL0–SWL7. Reference character BC denotes bit line contacts, each connected bit lines BLa, ZBLa, BLb, and ZBLb to the impurity-diffused areas of the MOS Trs. MC1 and MC2 each denote a memory cell.

Reference characters BIGa and BIGb denote bit line separation gates, are respectively connected to the pair of bit lines BLa and ZBLa which are connected to either of the memory cell pairs ((MC1, MC2)×2)) of every two pairs, and connected to the pair of bit lines BLb and ZBLb which are connected to either of the memory cell pairs of every two pairs adjacent to each other, and thereby select the pair of bit lines corresponding to the memory cell pair selected by the subword line to connect the selected pair to A,B of sense amplifier S/A.

In addition, reference characters MWL0–MWL7 denote main word lines formed by the second metal wirings. 1M denotes the first metal wiring.

The operation of the fifth embodiment will next be described.

Referring to FIG. 7, cell plate electrodes CP0–CP3, and subword lines SWL0–SWL7 to be the gate electrodes of the MOS Trs consist of the same wiring layer formed of polysilicon into which impurities are incorporated (doped polysilicon) or silicon-containing materials such as polycide and salicide such as WSix and CoSix. This wiring layer is also used for the gate electrode of the transistor in the CMOS logic process.

The capacitor has a planar-type capacitor structure in which a storage node is defined by the diffused layer on the semiconductor substrate. The insulation films existing just under subword lines SWL0–SWL7 and just under cell plate electrodes CP0–CP3 are the gate oxide film of the MOS Tr of the memory cell and the capacitor insulation film of the memory cell, respectively, and can be formed of the same oxide film or also oxide films having a different thickness through a dual-gate oxidation process. Additionally, bit lines BLa, ZBLa, BLb, and ZBLb have a CUB structure formed over the upper layers of cell plate electrodes CP0–CP3 by use of the first metal wiring and the like.

Thus, because a wiring layer for cell plate electrodes CP0–CP3 and the storage node need not to be newly added, and additionally cell plate electrodes CP0–CP3 and subword lines SWL0–SWL7 are formed of the same wiring layer by use of the planar-type capacitor structure, a difference in level between the memory array section and the peripheral circuit section is not produced. As a result, the memory cell array can be formed in the CMOS logic process without using planarization process by means of CMP (Chemical Mechanical Polishing process) or reducing the difference in level.

Figure 9:
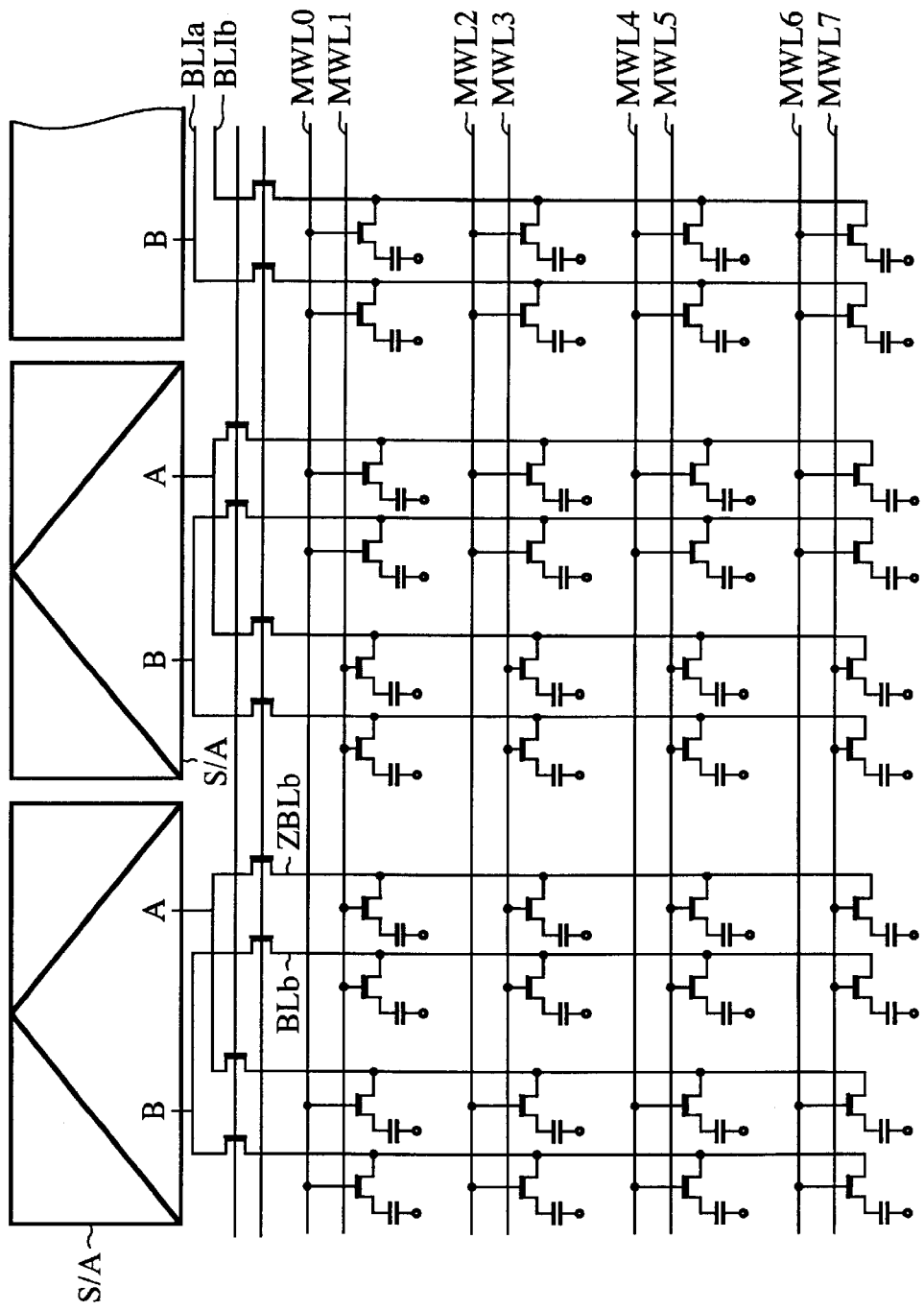
FIG. 9 is a circuit diagram showing the equivalent circuit of the DRAM memory cells according to the embodiment 5 of the present invention.
Figure 10:
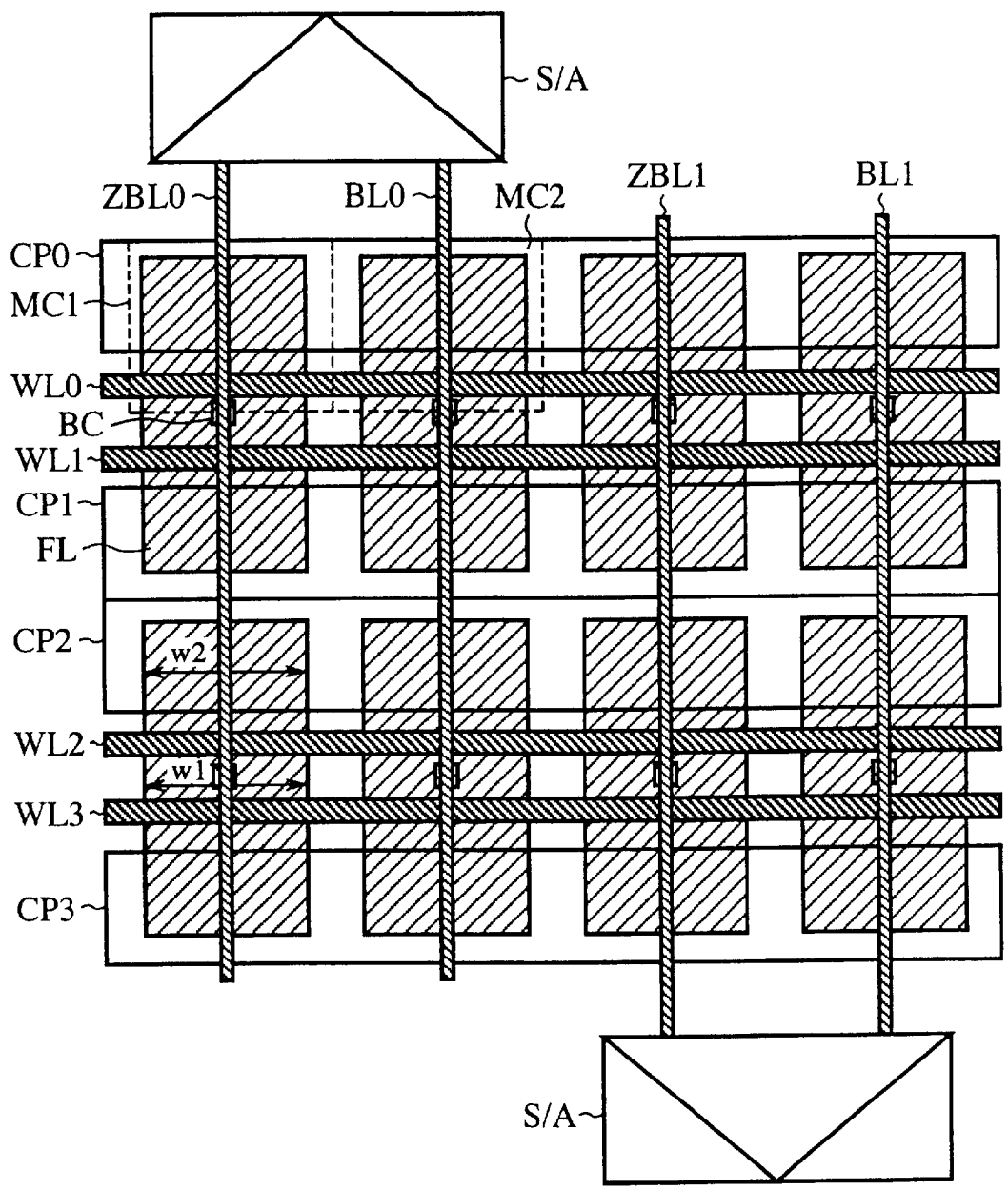
FIG. 10 is a layout view showing the layout of conventional DRAM memory cells.

FIG. 9 is a circuit diagram showing an equivalent circuit of the DRAM memory cell according to the embodiment 5 of this invention. The circuit operation of the DRAM memory cell will be described with reference to FIGS. 7, 8, and 9.

A row active command is given. When one of the subword lines SWL0–SWL7 are selected by input address, the two memory cells are respectively connected to the pair of bit lines.

For example, when the subword line SWL0 is selected, the memory cells MC1 and MC2 are connected to the pair of bit lines BLb and ZBLb. H level data is stored in one of the memory cells MC1 and MC2, while L level data is stored in the other thereof. Thus, one bit information is stored by use of the pair of the memory cells MC1 and MC2 as a memory unit of two cells mode (twin cell mode).

As shown in FIG. 9, the sense amplifier S/A connected at A,B with the pair of bit lines BLb and ZBLb differentially amplifies and outputs the potential of the pair of bit lines BLb and ZBLb.

In such a way, the array operation of one bit/two cells mode may ensure sufficiently data maintaining characteristics against a drawback in which a planer-type capacitor structure cannot ensure a capacitor capacitance sufficiently.

The subword lines SWL0–SWL7 in the embodiment 5, which is one word line in the prior art, are divided in the row direction by every two pairs of the memory cell pair to be a memory unit of one bit/two cells mode: (SWL0, SWL1), (SWL2, SWL3), (SWL4, SWL5) and (SWL6, SWL7) are alternately arranged. In FIG. 8, when one of the main word lines MWL0–MWL7 corresponding to the second metal wirings is selected by input address, one of the corresponding subword lines SWL0–SWL7 is selected. In other words, when the even-numbered main word lines MWL0, MWL2, MWL4, and MWL6 are selected, a memory cell pair connected to the pair of bit lines BLb and ZBLb is selected, and then a complementary data is read out from the pair of bit lines BLb and ZBLb. On the other hand, a memory cell pair connected with the pair of bit lines BLa and ZBLa is not selected, and the pair of bit lines BLa and ZBLa maintains a precharge potential level.

Reversely, when the odd-numbered main word lines MWL1, MWL3, MWL5, and MWL7 are selected, a memory cell pair connected to the pair of bit lines BLa and ZBLa is selected, and then a complementary data is read out from the pair of bit lines BLa and ZBLa. On the other hand, a memory cell pair connected to the pair of bit lines BLb and ZBLb is not selected, and the line of bit lines BLb and ZBLb maintains a precharge potential level.

In addition, the pairs of bit lines BLa, ZBLa, BLb, and ZBLb are connected to the sense amplifier S/A by way of the bit line separation gates BIGa and BIGb.

The bit line separation gates BIGa and BIGb are controlled by bit line separation gate control signals BLIa and BLIb corresponding to the second metal wirings shown in FIG. 8. That is, as the control signal BLIa falls, the separation gate BIGa is OFF state; as the control signal BLIb falls, the separation gate BIGb is OFF state.

According to the array control of the embodiment 5, when the even-numbered main word lines MW0, MWL2, MWL4 and MWL6 are selected, the BLIa signal falls and then the pair of bit lines BLb and ZBLb are connected to the sense amplifier S/A. Alternatively, when the odd-numbered main word lines MWL1, MWL3, MWL5 and MWL7 are selected, the BLIb signal falls and then the pair of bit lines BLa and ZBLa are connected to the sense amplifier S/A. That is, the single sense amplifier S/A shares the two pairs of bit lines, and the bit line separation gates BIGa and BIGb control on which pair of bit lines the read-out data should be differentially amplified.

However, continuing the access to a memory core, in the conventional DRAM, the bit line connected to non-selected memory cells on a selected sub-memory mat is put in a full amplitude of Vcc or 0 V. As shown in FIGS. 7–9, when the memory cell is composed of NMOS transistors, a potential of the gate voltage to source is 0 V in the transistor of the non-selected memory cell connected to the bit line which is put in a full amplitude. For this reason, an off current Ioff cannot be ignored, and the potential of the storage node is lowered in the memory cell which stores H level data. Such a condition is called "disturbed memory cell".

Since this memory cell, different from the conventional DRAM, has almost the same threshold value as that of logic transistors, it has a large off current Ioff. Accordingly, it is necessary to minimize a time duty to be disturbed.

As mentioned above, according to the embodiment 5, the memory cell pairs in one bit/two cells mode are only selected by every two pairs, the two pairs of bit lines located therebetween maintain a precharge level. Thereby, the time duty to be disturbed is controlled 0.5 at the maximum, to thereby improve disturb-refresh characteristics.

In addition, since the memory cells connected to the main word lines can be satisfied by the half of the memory cells arranged in the row direction, the load capacitance of the main word lines is lowered, while the rise/fall of the subword lines is responded rapidly, thereby performing high-speed access.

Further, the data of the memory cell pair is read out, the pair of bit lines maintains the precharge level, which is adjacent to that amplified differentially by the sense amplifier S/A, thereby improving noise durability.

Furthermore, the single sense amplifier S/A shares the pair of bit lines to two pairs, which allows a specific layout of alternately arranged sense amplifiers. With this manner, the number of bands of the sense amplifier on a memory mat may be reduced by half, thereby decreasing the size of the memory core.

What is claimed is:

1. A semiconductor memory comprising:
   a plurality of field patterns which are arranged in a close packed layout in a matrix;
   a cell plate electrode which is arranged on an active region of a capacitor of one of said field patterns;
   a word line which is arranged by two on said one field pattern;
   a bit line which is arranged on said cell plate electrode and to be orthogonal to said word line, and which are connected to an impurity diffused area of a transistor of said one field pattern; and
   a sense amplifier for differentially amplifying and outputting each potential of a pair of bit lines composed of two bit lines,
   wherein a width of the active region of the transistor of said one field pattern is formed narrower than that of the active region of the capacitor.

2. The semiconductor memory according to claim 1, wherein with respect to a row of a field pattern selected by two word lines, the row of the field pattern selected by neighboring two word lines is arranged offset by half a pitch.

3. The semiconductor memory according to claim 1, wherein a space between two word lines of one part where the bit line is connected with the impurity diffused area of the transistor is made wider than a space between two word lines of another part.

4. The semiconductor memory according to claim 1, wherein a dummy pattern is formed adjacent to a part where a bit line of the field pattern is connected with the impurity diffused area of the transistor.

5. The semiconductor memory according to claim 1, wherein the word line is divided by two pairs of memory cell pairs to be a memory unit of one bit/two cells mode and memory cell pairs of every two pairs are selected by a divided word line, so that the memory cell pairs of every two pairs adjacent to each other cannot be selected by the divided word line.

6. The semiconductor memory according to claim 5, wherein a bit line separation gate is connected to a pair of bit lines which are connected to one memory cell pair of the memory cell pairs of every two pairs, and is also connected to a pair of bit lines which are connected to one memory cell pair of the memory cell pairs of every two pairs adjacent to each other, and a separation gate selects a pair of bit lines corresponding to the memory cell pair selected by the word line and connects selected pair with a sense amplifier.

* * * * *